(12) United States Patent
Yachareni et al.

(10) Patent No.: US 6,493,266 B1
(45) Date of Patent: Dec. 10, 2002

(54) SOFT PROGRAM AND SOFT PROGRAM VERIFY OF THE CORE CELLS IN FLASH MEMORY ARRAY

(75) Inventors: Santosh K. Yachareni, Santa Clara, CA (US); Darlene G. Hamilton, San Jose, CA (US); Binh Q. Le, San Jose, CA (US); Kazuhiro Kurihara, Sunnyvale, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 17 days.

(21) Appl. No.: 09/829,193

(22) Filed: Apr. 9, 2001

(51) Int. Cl.[7] .............................. G11C 11/34
(52) U.S. Cl. ............................ 365/185.22; 365/185.24
(58) Field of Search ..................... 365/185.22, 185.24

(56) References Cited

U.S. PATENT DOCUMENTS

| | | | | |
|---|---|---|---|---|
| 5,600,593 A | * | 2/1997 | Fong | 365/185.19 |
| 5,774,400 A | | 6/1998 | Lancaster et al. | 365/185.3 |
| 5,963,477 A | | 10/1999 | Hung | 365/185.22 |
| 6,011,725 A | | 1/2000 | Eitan | 365/185.33 |
| 6,172,909 B1 | | 1/2001 | Haddad et al. | 365/185.19 |
| 6,344,994 B1 | * | 2/2002 | Hamilton et al. | 365/185.05 |

FOREIGN PATENT DOCUMENTS

JP 0106075 * 5/1991 ........... G11C/16/02

OTHER PUBLICATIONS

Betty Prince, "Semiconductor Memories", 1983, Wiley, 2nd edition, pp. 94–95.*

* cited by examiner

Primary Examiner—M. Tran
(74) Attorney, Agent, or Firm—Eschweiler & Associates, LLC

(57) ABSTRACT

A method and system are disclosed for memory cell soft program and soft program verify, to adjust, or correct the threshold voltage between a target minimum and maximum, which may be employed in association with a dual bit memory cell architecture. The method includes applying one reference voltage signal to the over erased core cell, and a different reference voltage signal to the reference cell, comparing the two currents produced by each, selectively verifying proper soft programming of one or more bits of the cell, determining that the dual bit memory cell is properly soft programmed. The method may also comprise selectively re-verifying proper soft programming of the cells after selectively soft programming at least one or more bits of the cell.

27 Claims, 9 Drawing Sheets

SOFT PROGRAM AND SOFT PROGRAM VERIFY OF THE CORE CELLS IN FLASH MEMORY ARRAY

FIELD OF INVENTION

The present invention relates generally to memory systems and in particular, to flash memory systems and methods wherein a new reference cell structure, and the application of unique reference voltages during soft program and soft program verify operations, eliminates previous problems of trimming a reference cell to a low threshold voltage, and tightens the erased core cell threshold voltage distribution, which also facilitates faster programming times.

BACKGROUND OF THE INVENTION

Flash memory is a type of electronic memory media which can be rewritten and hold its data without power. Flash memory devices generally have life spans from 100K to 1 MEG write cycles. Unlike dynamic random access memory (DRAM) and static random access memory (SRAM) memory chips, in which a single byte can be erased, flash memory is typically erased and written in fixed multi-bit blocks or sectors. Evolving out of electrically erasable read only memory (EEPROM) chip technology, which can be erased in place, flash memory is less expensive and more dense. This new category of EEPROMs has emerged as an important non-volatile memory which combines the advantages of EPROM density with EEPROM electrical erasability.

Conventional flash memories are constructed in a cell structure wherein a single bit of information is stored in each cell, for example, as illustrated in prior art FIG. 1a, and designated at reference numeral 10. In such single bit memory architectures, each cell 10 typically includes a metal oxide semiconductor (MOS) transistor structure having a source 12, a drain 14, and a channel 16 in a substrate or P-well 18, as well as a stacked gate structure 20 overlying the channel 16. The stacked gate 20 may further include a thin gate dielectric layer 22 (sometimes referred to as a tunnel oxide) formed on the surface of the P-well. The stacked gate 20 also includes a polysilicon floating gate 24 overlying the tunnel oxide 22 and an interpoly dielectric layer 26 overlying the floating gate. The interpoly dielectric layer 26 is often a multilayer insulator such as an oxide-nitride-oxide (ONO) layer having two oxide layers sandwiching a nitride layer. Lastly, a polysilicon control gate 28 overlies the interpoly dielectric layer 26.

The control gate 28 is connected to a word line associated with a row of such cells to form sectors of such cells in a typical NOR configuration. In addition, the drain regions 14 of the cells are connected together by a conductive bit line. The channel 16 of the cell conducts current between the source 12 and the drain 14 in accordance with an electric field developed in the channel 16 by the stacked gate structure 20. In the NOR configuration, each drain terminal 14 of the transistors within a single column is connected to the same bit line. In addition, each flash cell associated with a given bit line has its stacked gate terminal 28 coupled to a different word line, while all the flash cells in the array have their source terminals 12 coupled to a common source terminal. In operation, individual flash cells are addressed via the respective bit line and word line using peripheral decoder and control circuitry (not shown) for programming (writing), reading or erasing functions.

Such a conventional single bit stacked gate flash memory cell 10 is programmed by applying a relatively high voltage to the control gate 28 and connecting the source 12 to ground and the drain 14 to a predetermined potential above the source. A resulting high electric field across the tunnel oxide 22 leads to a phenomena called "Fowler-Nordheim" tunneling. During this process, electrons in the core cell channel region 16 tunnel through the gate or tunnel oxide 22 into the floating gate 24 and become trapped in the floating gate since the floating gate is surrounded by the interpoly dielectric 26 and the tunnel oxide 22. As a result of the trapped electrons, the threshold voltage of the cell 10 increases. This change in the threshold voltage (and thereby the channel conductance) of the cell created by the trapped electrons is what causes the cell to be programmed.

In order to erase a conventional single bit stacked gate flash memory cell 10, a relatively high voltage is applied to the source 12, and the control gate 28 is held at a negative potential, while the drain 14 is allowed to float. Under these conditions, a strong electric field is developed across the tunnel oxide 22 between the floating gate 24 and the source 12. The electrons that are trapped in the floating gate 24 flow toward and cluster at the portion of the floating gate overlying the source region 12 and are extracted from the floating gate and into the source region by way of Fowler-Nordheim tunneling through the tunnel oxide 22. As the electrons are removed from the floating gate 24, the cell 10 is erased.

In conventional single bit flash memory devices, an erase verification is performed to determine whether each cell in a block or set of such cells has been properly erased. Current single bit erase verification methodologies provide for verification of bit or cell erasure, and application of supplemental erase pulses to individual cells which fail the initial verification. Thereafter, the erased status of the cell is again verified, and the process continues until the cell or bit is successfully erased or the cell is marked as unusable.

After erasure, some cells may have been over erased, producing an excessively low threshold voltage and corresponding high drain current leakage which may cause problems with later read, program verify, or even erase operations. The process of soft programming has typically been adopted as a means to correct the over erased cells. Usually this process involves applying one or more program pulses to the over erased cells. The soft program process raises (or corrects) the low threshold voltages of the identified cells, to effectively narrow the distribution of erased cell threshold voltages across a flash memory array.

Recently, dual bit flash memory cells have been introduced, which allow the storage of two bits of information in a single memory cell. FIG. 1b illustrates an exemplary prior art dual bit memory cell 50. The memory cell 50 comprises a silicon dioxide layer 52, a P-type substrate 54 has buried N+ source 56 and N+ drain 58 regions. The silicon dioxide 52 is sandwiched between two layers of silicon nitride 60, and 62. Alternatively, the layer 52 may comprise buried polysilicon islands or any other form of charge trapping layer.

Overlying the nitride layer 60 is a polysilicon gate 64. This gate 64 is doped with an N-type impurity (e.g., phosphorus). The memory cell 50 is capable of storing two data bits, a left bit represented by the dashed circle A and a right bit represented by the dashed circle B. The dual bit memory cell 50 is generally symmetrical, thus the drain 58 and the source 56 are interchangeable. Thus, the left junction 56 may serve as the source terminal and the right junction 58 as the drain terminal with respect to the right bit B. Likewise, the right junction 58 may serve as the source terminal and the left junction 56 as the drain terminal for the left bit A.

After erasure of a dual bit cell, the conventional soft programming, and soft program verification methods employed with single bit stacked gate architectures may be applied in certain circumstances to such dual bit devices, but are problematic at best because the end of the erase distribution $V_T$'s are not close to zero, but are at 0.7 volts. Therefore, there is a need for new and improved soft programming, and soft program verification methods and systems, which ensure proper control of the erased cell threshold voltage distribution of data bits in a dual bit memory architecture, and which account for the structural characteristics thereof.

SUMMARY OF THE INVENTION

A system and methodology are provided which overcome or minimize the problems and shortcomings of conventional memory cell soft program verification schemes and systems. The invention includes methods and systems for verifying an erased cell threshold voltage of one or more dual bit cells in a memory device, such as a flash memory. The invention allows for efficient and thorough soft program verification, which minimizes inadvertent, undesired data retention, over-erase and cell read leakage issues associated with the dual bit cell architecture. The invention provides significant advantages when employed in association with dual bit memory cells wherein only one bit thereof is actively used for data storage. However, it will be recognized that the invention finds utility in association with dual bit memory cell architectures generally, and that the invention is thus not limited to any particular dual bit cell usage implementation or configuration.

In accordance with one aspect of the invention, there is provided a method of verifying an erased cell threshold voltage of a dual bit memory cell. The erased cell threshold voltage verification method comprises the steps of performing a determination of whether a first, or second bit in the dual bit memory cell is properly soft programmed.

Verification of proper soft programming in a dual bit memory cell configuration according to the inventive method ensures that undesirable data retention or bit over-erase problems (resulting in a low threshold voltage, and consequent high leakage current) do not adversely affect the operation (e.g., proper erasure, read/write functionality) of the core cell. In this manner, the invention provides significant performance advantages over conventional methods typically utilized in soft programming of single bit (e.g., stacked gate) memory cell types. The method may further comprise repeating the method for another dual bit memory cell, whereby a byte-wise soft programming verification may be accomplished, for example, in association with a chip erase or sector erase operation.

A soft program verification of a core cell threshold voltage may be performed through the application of a voltage to the memory cell being verified along with an application of a different voltage to a reference cell with a known threshold voltage, then comparing the currents of the core cell under analysis and the reference cell, respectively. When this comparison indicates that one or more of the soft programming pulses have reduced the current in the cell being verified to less than that of the reference cell, the core cell threshold voltage is above a target minimum erased cell threshold voltage. Moreover, according to one aspect of the invention, the process may be repeated for each cell in the array until each erased cell threshold voltage is above a target minimum.

In addition, the method may also include an accounting of the number of soft program pulses which are applied to any one core cell, or block of core cells, in the event the cell, or block of cells are not responding to soft program verify. In this case, where a predetermined maximum soft program pulse count is exceeded, the cell, or block of cells is identified as having failed soft programming, and therefore avoid an endless soft program loop. For example, this method may include steps of initializing a pulse counter before each new cell address is selected, performing the soft program verification, determining whether the pulse counter has exceeded the preset maximum pulse count, then, if the count has not been exceeded, continuing to a step of incrementing the pulse counter as another soft program pulse is applied, or if the pulse count has been exceeded, a further step may be to proceed with appropriate actions for a failed soft programming.

According to another aspect of the invention, there is provided a method to custom tailor a subsequent soft programming pulse (e.g., pulse width, pulse height) according to the differential current in the comparator, to greatly speed up the overall soft programming process, or to minimize the effects of over soft programming.

The method of the present invention may include several selected core cells, or blocks of cells for soft programming operations, as well as selected core cells, or blocks of cells for soft program verifications.

According to another aspect of the invention, there is provided a method for soft programming and soft program verifying a plurality of dual bit flash memory cells, which includes the steps of soft programming the plurality of dual bit flash memory cells, verifying proper soft programming of a first bit in at least one of the plurality of dual bit flash memory cells, verifying proper soft programming of a second bit in the at least one of the plurality of dual bit flash memory cells, and determining that the cell is properly soft programmed if the first and second bits are properly soft programmed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
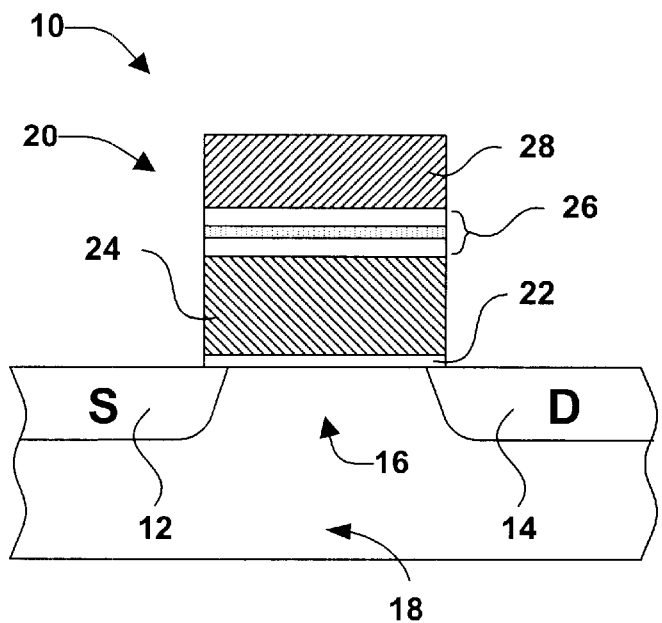
FIG. 1a is a fragmentary cross section view of an exemplary prior art, single bit flash memory cell.
Figure 1B:
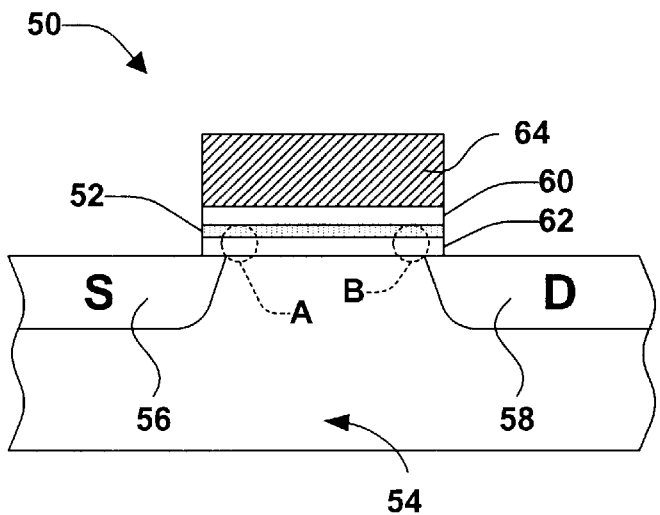
FIG. 1b is a fragmentary cross section view of an exemplary prior art dual bit memory cell in which various aspects of the present invention may be implemented.

The following is a detailed description of the present invention made in conjunction with the attached figures, wherein like reference numerals will refer to like elements throughout. The invention provides a method and a system for soft programming, and verifying proper soft programming of one or more dual bit memory cells, and may be used in conjunction with a chip or sector soft program and soft program verification operation in a flash memory device. For example, a sector soft programming verify operation may be performed in order to apply soft programming pulses to each such cell in a flash memory device. Thereafter, the invention may be employed in order to verify which cells in the device have been properly soft programmed.

In addition, the invention selectively attempts to re-soft program cells (e.g., via selective application of soft program voltage pulses to one or both individual bits in a dual bit memory cell) which have been over erased during the erase part of the algorithm that is performed before the soft program verify operation. The invention also provides for selective re-verification of proper soft programming of one or both bits in a dual bit cell.

According to one aspect of the invention, proper soft program verification may be accomplished through generating a soft program core cell verification voltage and generating a reference cell verification voltage having a value which is different from the core cell verification voltage. The method further includes applying the core cell verification voltage to a gate portion of an over erased core cell to thereby generate a core cell current, and applying the reference cell voltage verification voltage to a gate portion of a reference cell to thereby generate a reference cell current. Lastly, the method includes determining whether a threshold voltage associated with the erased core cell is less than a predetermined threshold based on a comparison of the core cell current and the reference cell current.

Although the invention is hereinafter illustrated and described in association with a dual bit memory cell architecture wherein only one bit of each cell is used for data storage, it will be appreciated that the invention is applicable to other type architectures and other dual bit architecture usage schemes.

Figure 2:
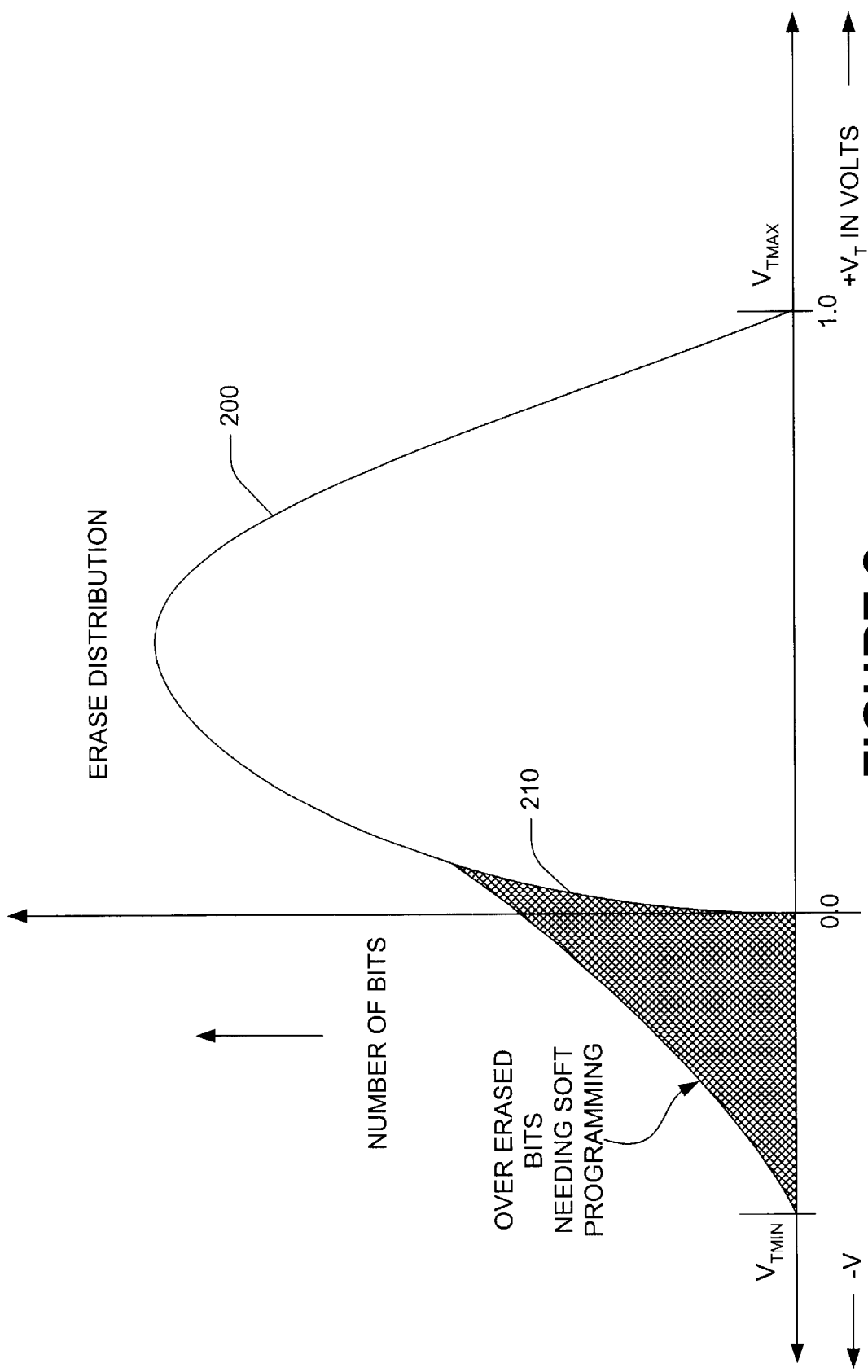
FIG. 2 is a distribution plot illustrating an erased cell threshold voltage distribution of a number of core cells of an exemplary prior art flash memory array.

Referring again to the drawings, FIG. 2 illustrates a characteristic curve known as the erased core cell threshold voltage distribution. FIG. 2 illustrates how the core cell threshold voltages in a flash memory array can differ from one another following an erase operation as shown by curve 200 that represents the number of cells having particular values of threshold voltage $V_T$. It has been found that the least erased cells will have relatively high threshold voltages in the region of $V_{TMAX}$, whereas the most erased cells (sometimes referred to as "over-erased cells") will have low threshold voltages in the region of $V_{TMIN}$ that can be zero or negative. However, the threshold voltage distribution curve segment 210 indicates that there is still a number of erased cells that have a relatively low threshold voltage. After correcting the $V_T$ of the most over erased cells thru the soft program and soft program verify operations, the erased core cell threshold voltage distribution curve 200 will narrow on the low end of the curve (shown by curve segment 210) to approximately 0 Volts.

Since the background leakage current of a cell varies as a function of threshold voltage, the lower the threshold voltage of an erased cell, the higher the leakage current will be. Because there may be as many as 512 cells connected to a bitline, the total background leakage current may disadvantageously exceed the cell read current thereby leading to a subsequent read error. It is therefore desirable to prevent cells from not only being over-erased, but to reduce the threshold voltage distribution to as low a range as possible, with ideally all cells having the same high threshold voltage after erase.

Figure 3:
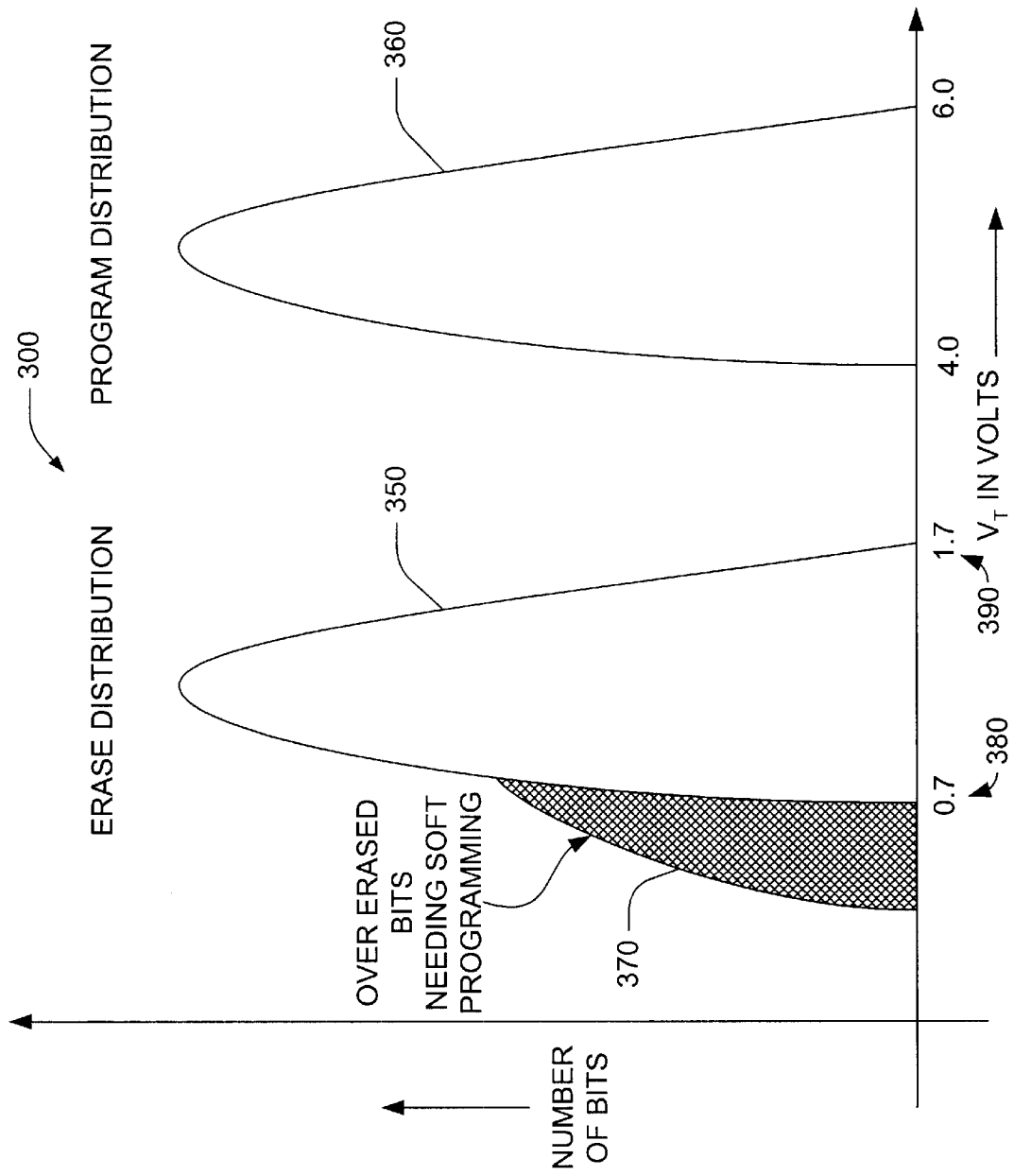
FIG. 3 is a distribution plot illustrating an erased cell threshold voltage distribution and a programmed cell threshold voltage distribution of a number of core cells of an exemplary dual bit memory array, together with over-erased bits which require soft programming according to the invention.

Similarly, FIG. 3 illustrates characteristic cell threshold voltage distribution curves of an exemplary dual bit memory array illustrating a desired erased cell threshold voltage distribution 350, and a programmed cell threshold voltage distribution 360. As discussed earlier, after erasure, some cells may have been over erased, producing an excessively low threshold voltage (shaded region 370) and corresponding high drain current leakage which may cause problems with later read, program verify, or even erase operations. Conventional methods of chip, sector, or cell soft programming typically used in the single bit stacked gate cell, attempted to correct the over erased cells, by applying one or more program pulses to the over erased cells. Soft programming raises (or corrects) the low threshold voltages on these cells, to effectively narrow the distribution of cell threshold voltages across a flash memory array. Soft program verification was done by comparing the current produced in the selected core cell, and its' associated erased cell threshold voltage, to that of a reference cell with an acceptable threshold voltage.

Comparing FIGS. 2 and 3, one sees that the prior art single bit cell was typically soft program corrected to a $V_{TMIN}$ of about 0 volts, whereas the dual bit erased cell, soft program corrected $V_{TMIN}$ increases to about 0.7 volt. In the stacked gate cell prior art, the reference cell was manufactured similar to the selected core cell(s) they were compared to, and both the reference and core cells were given the same gate voltages during the soft program verify. In the dual bit cell architecture, however, the reference cell structure can not readily be made the same as the core cells, yet a soft program verification must still be made to produce a desired erased core cell $V_T$ (e.g., $V_T > 0.7$ volts). The inventors have found in the trimming of the $V_T$ of the new reference cell structure, that attempts to trim the $V_T$ to less than about 1.7 volts results in unusably high cell leakage current.

In accordance with the invention, and the solutions to these problems, the inventors devised methods and systems to generate different voltages to be applied to the gate of the new reference cell structure and the core cell structure, respectively, to allow the reference cell to produce a current which compares to an erased core cell current associated with a $V_T$>0.7 volts.

Figure 4:
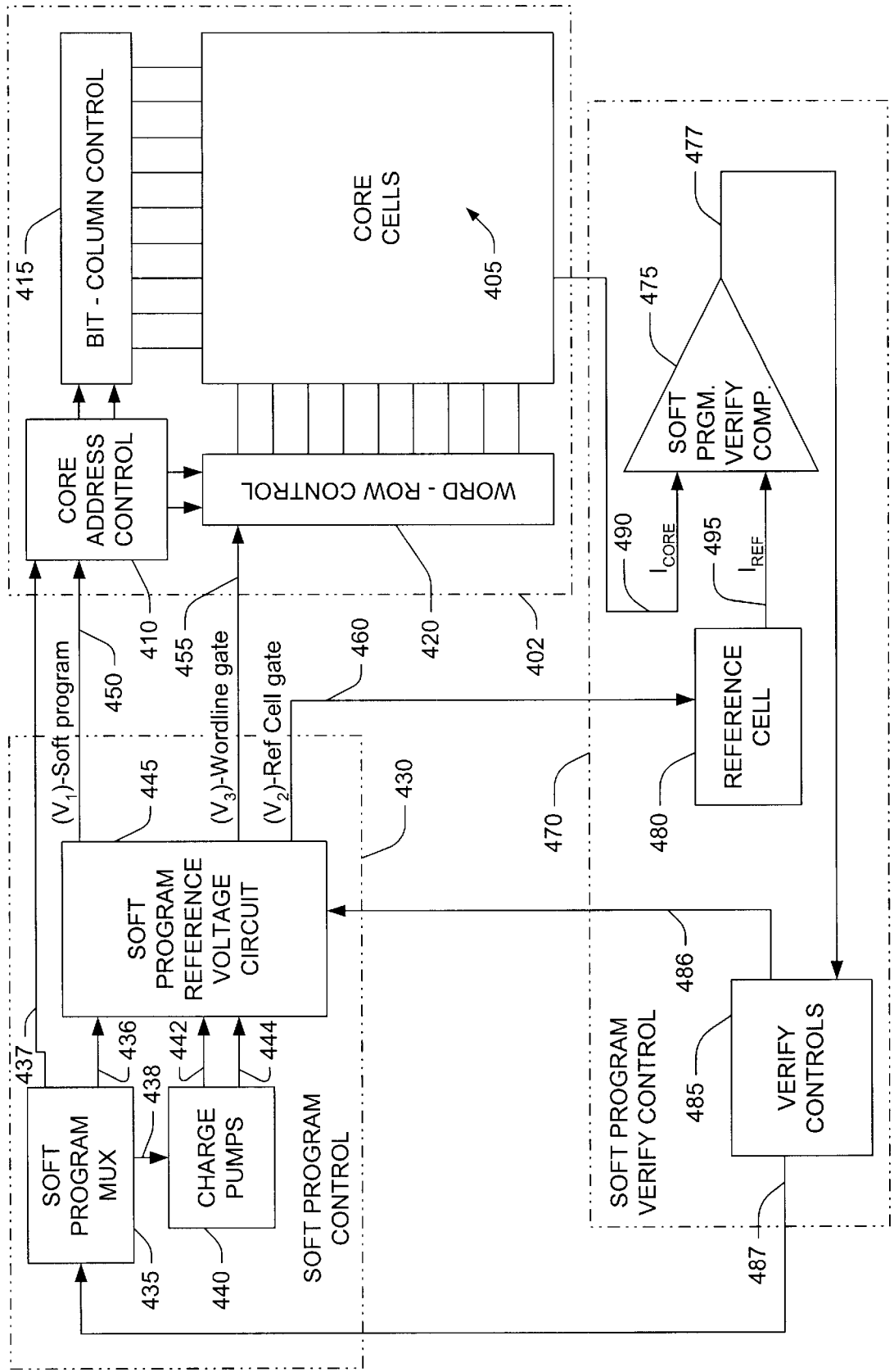
FIG. 4 is a system level functional block diagram illustrating an exemplary soft program and soft program verification system in which various aspects of the invention may be carried out.

The present invention may be understood and its advantages appreciated in FIG. 4 which illustrates a system level functional block diagram of an exemplary soft program and soft program verification system 400 in which various aspects of the invention may be accomplished. For example, the system of FIG. 4 prevents erased memory cells from exhibiting an erased cell threshold voltage below a predetermined level, may be comprised of the three functional blocks shown.

A flash memory array system 402 of FIG. 4, includes an array of core cells 405 which are typically subdivided into sectors, blocks, and individual core cells. The cells are arranged in rows and columns, with all of the cells in a row having their control gate connected to a common word line. The drains of the cells located in a particular column are all connected to a common bit line while all the cells of the array have their sources coupled to a common source line 490 to enable the measurement of drain current in the core cells ($I_{CORE}$) at 490. The memory system 402, also has address controls 410 which acts as a matrix of multiplexors working in conjunction with bit-column controls 415 and word-row controls 420 used to select a sector, block, or individual cells of the core 405. The row control block 420 is connected to the word lines of the cells of the array and a column control block 415 is connected to the bit lines of the array. In operation, individual flash cells may be individually addressed via the respective bit line and word line using peripheral decoder and control circuitry for programming (writing), reading or erasing functions. These flash core cells 405 will be the object of the soft program and soft program verify operations of the present invention, and discussed in greater detail in the following sections.

A soft program control circuit 430 of FIG. 4, is configured with a soft program multiplexer 435 charge pumps 440 and a soft program reference voltage circuit 445 to generate a soft program voltage ($V_1$) at 450, a soft program core cell verify voltage ($V_3$) at 455, and a reference cell verification voltage ($V_2$) at 460. In response to a logic command to enter the soft program mode (or for example, as the result of a soft program verify comparison command 487), the multiplexer circuit 430 generates a soft program enable signal 436 to control the reference logic circuit 445 or for example, the next core address selection 437. The multiplexer circuit 435 also generates a regulated, clamped supply voltage 438 to the wordline charge pump circuit of 440. The charge pumps of 440 include a Drain charge pump which generates a supply voltage for program verify operations, and a wordline charge pump circuit configured to generate a boosted wordline supply voltage for the voltage divider within the soft program reference voltage circuit 445. The soft program reference voltage circuit 445 takes the soft program enable signals 436 and 486, and charge pump voltages 442 and 444, used in a reference logic circuit multiplexer within 445 to generate the discrete soft program and soft program verify voltages $V_1$, $V_2$, & $V_3$ via, for example, a voltage divider.

A soft program verify control circuit 470 according to one exemplary aspect of the present invention of FIG. 4, is configured with a reference cell 480 which uses $V_2$, the reference cell verification voltage 460 to generate the reference cell current ($I_{REF}$) at 495. The control circuit 470 further includes a soft program verify comparator circuit 475 which is configured to compare the over erased core cell verification current ($I_{CORE}$) at 490 to the reference cell current ($I_{REF}$) at 495 to generate an output indication on 477 of whether the selected erased core cell threshold voltage is below a predetermined level. The soft program verify comparator circuit is further operable to transfer the $V_T$ indication to a verify controls circuit 485 which is configured to output one or more soft program control signals 486 and 487 for use in soft programming based on the indication.

During operation, when comparator 475 of the soft program verify control circuit 470, has made the determination that the selected core cell $V_T$ is less than 0.7 volts, comparator 475 provides signal 477 to initiate a predetermined soft program pulse from verify controls circuit 485 via 487 back to the soft program control circuit 430.

Alternately, according to another aspect of the present invention, there is provided a system and method to custom tailor a subsequent soft programming pulse (e.g., pulse width, pulse height) according to the differential current in the comparator 475, to greatly speed up the overall soft programming process, or to minimize the effects of over soft programming. To accomplish this, the differential current could be measured in a sense amplifier (e.g., differential current amplifier) at 475 which would be conveyed via 477 to the verify controls 485 configured to convert the differential current produced at 475 into some combination of proportional pulse width, or pulse height modulation of the soft program pulse.

In another variation of the present invention, there is provided a system and method to custom tailor a subsequent soft programming pulse (e.g., pulse width, pulse height) through the use of a look-up table located in a portion of the core memory array 405, or in a separate memory, wherein the differential current produced at 475 may be bracketed into two or more levels which would result in the selection of an appropriate optimized pulse width/height modulation of the soft programming pulse. Yet another variation and aspect of the invention is provided by the method, wherein the flash memory array as a whole is selected, and the differential current produced at 475 may be used to generate some combination of proportional pulse width, or pulse height modulation of the soft program pulse, or a whole series of pulses as a pulse string which is thereby tailored to the flash memory array as a whole for subsequent soft program operations.

Figure 5A:
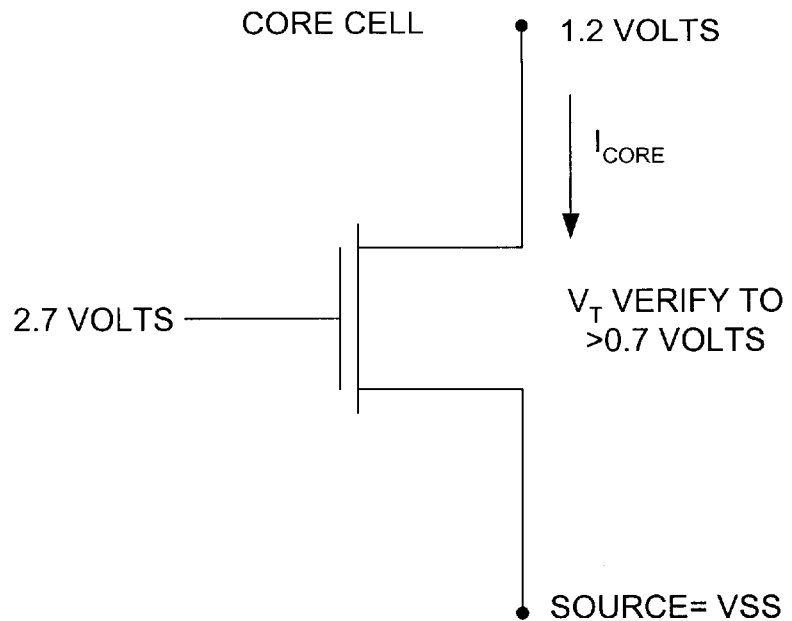
FIG. 5a is a schematic diagram illustrating an exemplary core cell, core current, and gate voltage in the system of FIG. 4.
Figure 5B:
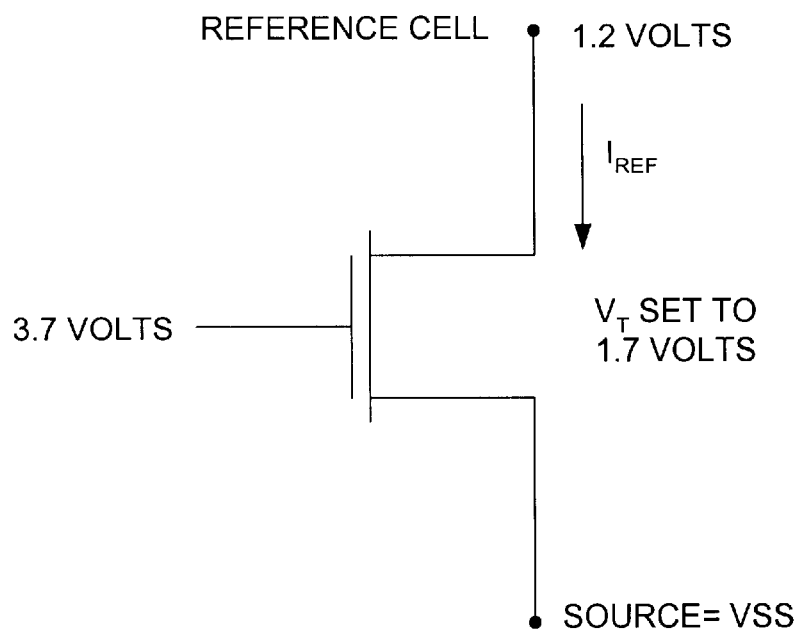
FIG. 5b is a schematic diagram illustrating an exemplary reference cell, reference current; and gate voltage in the system of FIG. 4.

The inventors found, as shown in FIGS. 5a, and 5b, that if they supplied a predetermined drain-source bias of about 1.2 volts to both the core cell and reference cell drains, and approximately 2.7 volts to the core cell gate, and about 3.7 volts to the reference cell gate, the currents would be equivalent if the core cell $V_T$ was equal to 0.7 volt.

The development of this reference cell voltage is as follows:

Using the equation:

$$I_D = k(V_{GS} - V_T)^2$$

for the erased core cell:

$$I_D\text{CORE} = k(V_{GS}\text{CORE} - V_T\text{CORE})^2$$

for the reference cell:

$$I_D\text{REF} = k(V_{GS}\text{REF} - V_T\text{REF})^2$$

given we want:

$$V_T\text{CORE} \geq 0.7V, \text{ and } V_T\text{REF} = 1.7V$$

now, for the reference cell and the core cell currents to compare equally:

$$I_D\text{REF} = I_D\text{CORE}$$

and:

$$k(V_{GS}\text{REF} - V_T\text{REF})^2 = k(V_{GS}\text{CORE} - V_T\text{CORE})^2$$

dividing thru:

$$V_{GS}REF - V_T REF = V_{GS}CORE - V_T CORE$$

solving for the new ref.:

$$V_{GS}REF = V_{GS}CORE - V_T CORE + V_T REF$$

substituting given values:

$$V_{GS}REF = V_{GS}CORE - 0.7 + 1.7$$

plug in a core cell value:

$$V_{GS}REF = 2.7 - 0.7 + 1.7$$

we have:

$$V_{GS}REF = 3.7 \text{ volts}$$

Therefore, if the currents through the core cell and reference cell are equal, then the core cell $V_T$ is 0.7 volt. Otherwise, if the core cell current exceeds the reference cell current, the core cell $V_T$ is less than 0.7 volts (a predetermined threshold) and requires another soft programming pulse.

Figure 6:
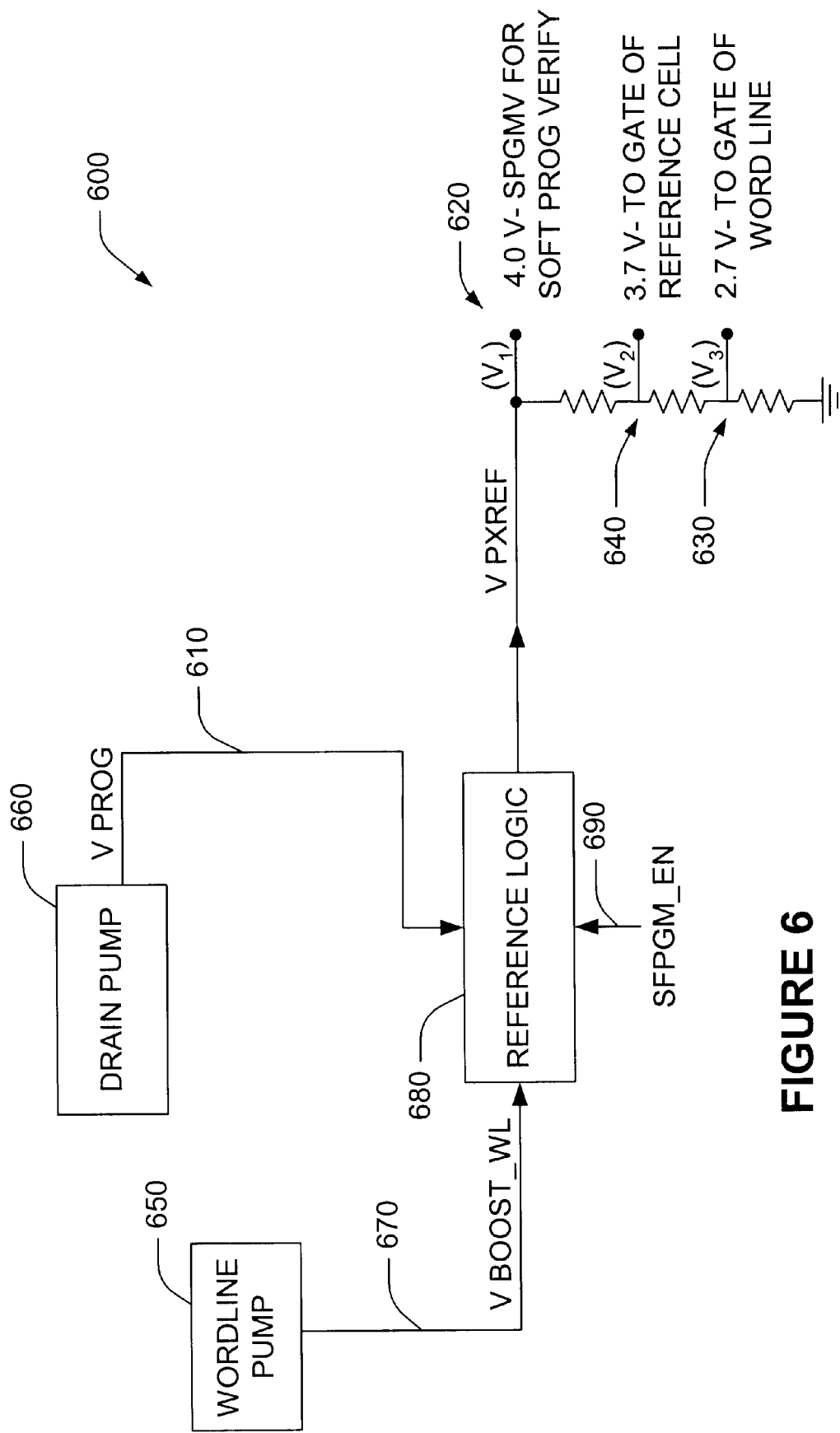
FIG. 6 is a functional block diagram illustrating a soft program reference voltage and charge pump logic circuit of the system of FIG. 4.

Referring now to the functional block diagram of FIG. 6, an exemplary method and system 600 is illustrated for generating the various voltages required in the soft program control circuit 430 of FIG. 4; for example, voltages for soft programming 610, soft programming verify 620, wordline (core cell) gate 630, and the reference cell gate reference voltage 640. A wordline charge pump circuit 650 generates a boosted supply voltage 670, through a reference logic circuit 680, for the soft program verify supply 620, in response to a soft program mode enable signal 690. The drain charge pump circuit 660 generates a boosted programming voltage 610 to the reference logic circuit 680 in response to a program mode signal (not shown). As can be seen from FIG. 6, the soft program control system 600 is operable to generate multiple voltages (for example, via a resistor network) having different values (e.g., $V_1 \neq V_2 \neq V_3$) for use in a soft program verify mode. In the above manner, unique voltages are provided for the core cell and reference cell, respectively.

Figure 7:
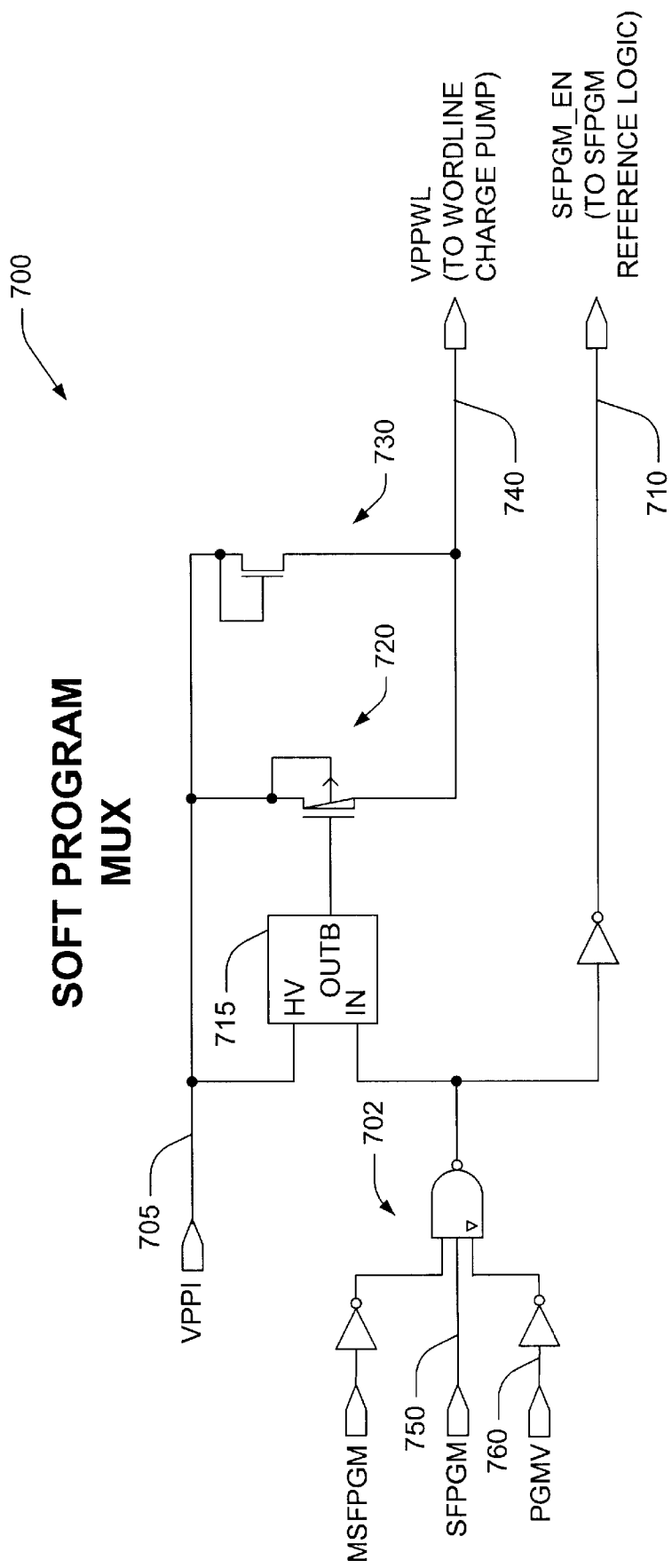
FIG. 7 is a schematic diagram illustrating an exemplary soft program multiplexer (hereinafter referred to as "mux") logic circuit of the system of FIG. 4.

FIG. 7 is a schematic diagram illustrating an exemplary soft program mux logic circuit 700 (e.g., relating to the program mux 435 of FIG. 4). This multiplexer circuit 700 uses a network of logic gates 702 to generate a soft program enable signal 710 to the reference logic circuit 680 of FIG. 6 in response to the soft program mode signal fed thru 702. The multiplexer circuit 700 also uses the program supply voltage 705 controlled by a regulator transistor 720 which is held in state by a latch 715 to generate a supply voltage 740 which is clamped by a diode 730 and fed to the wordline charge pump circuit 650 of FIG. 6.

Figure 8:
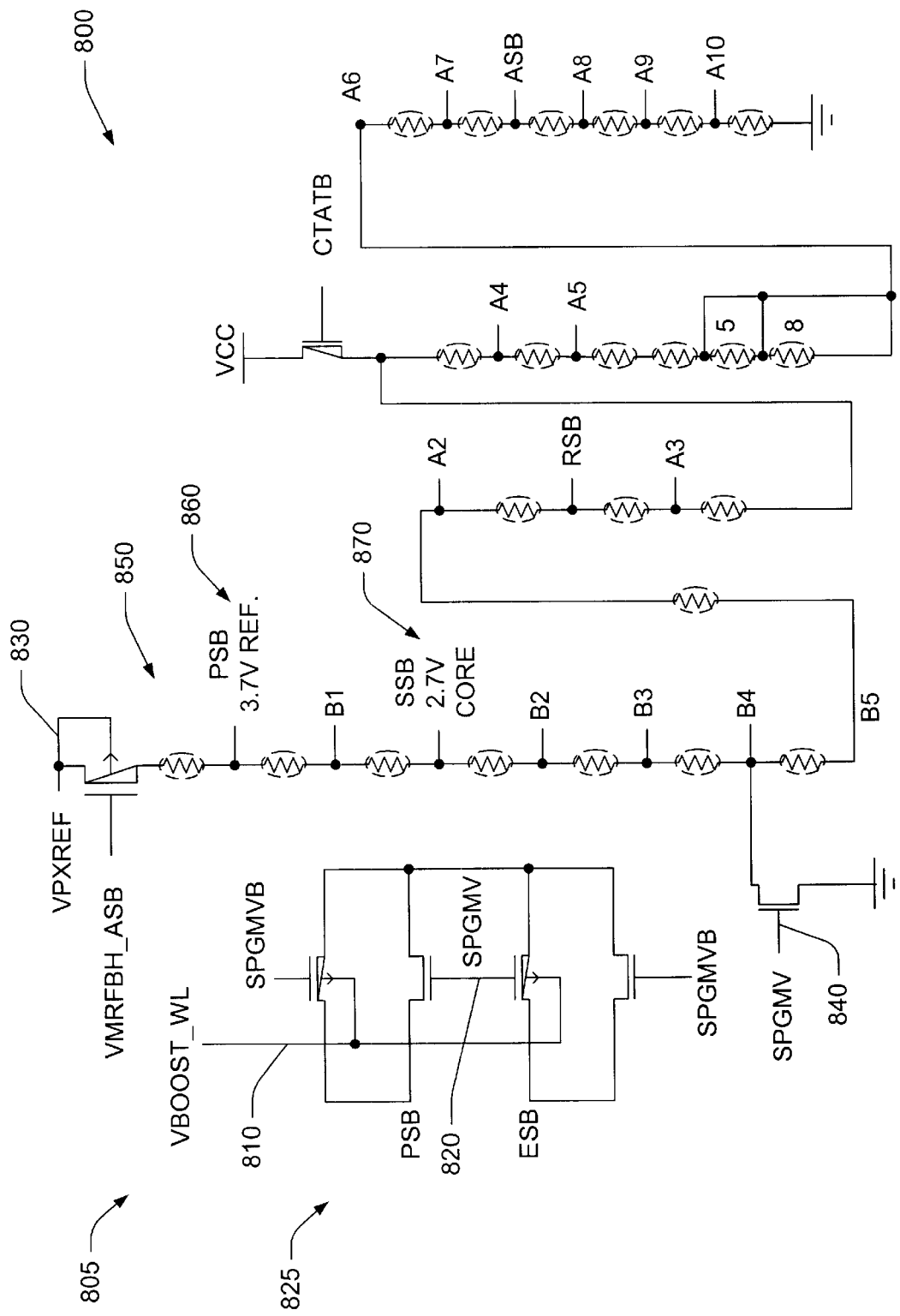
FIG. 8 is a schematic diagram illustrating details of an exemplary soft program reference voltage logic circuit, and voltage divider circuit of the system of FIG. 6.

FIG. 8 is a schematic diagram 800 illustrating more of the details of an exemplary soft program reference voltage logic circuit 805, and voltage divider circuit 850 (e.g., relating to the circuit 600 of FIG. 6). The charge pump boosted wordline voltage 810 is held by latch 825 to supply the soft program verify supply 820 (or 620 of FIG. 6), which enters at regulator transistor 830, and at the gate of the soft program mode transistor 840, to set-up the voltage divider 850 ratios to produce the 3.7 volt reference cell gate reference voltage 860, and the 2.7 volt erased core cell gate reference voltage 870. In the above exemplary manner, voltages having different values are provided so that the core cell and the reference cell will have their necessary gate voltages applied thereto in order to evaluate whether the erased core cell $V_T$ is above a predetermined value.

According to another aspect of the present invention, a method of preventing erased memory cells from exhibiting an erased cell threshold voltage below a predetermined level is provided.

Figure 9:
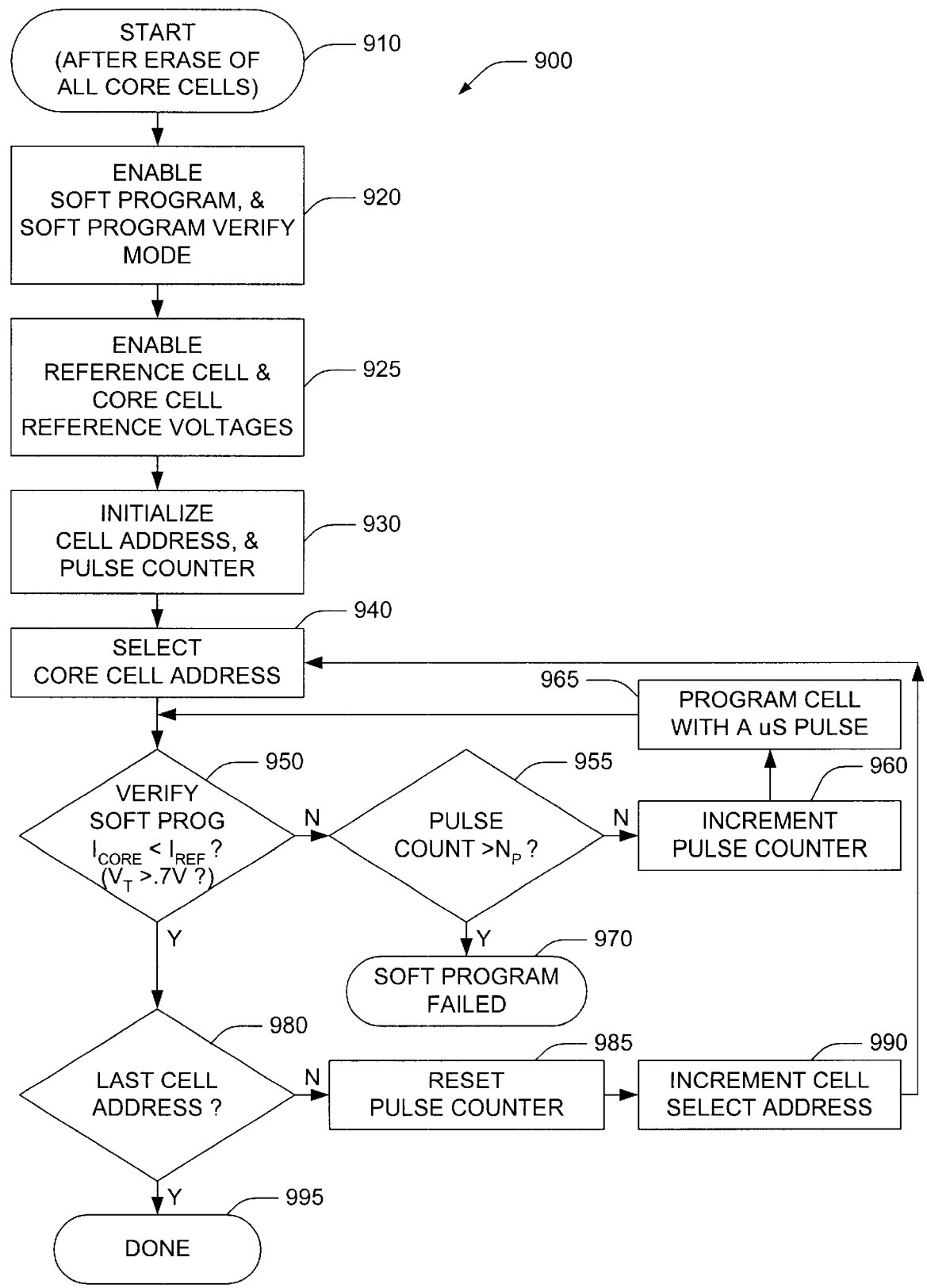
FIG. 9 is a flow diagram illustrating an exemplary method for verifying memory cell soft programming according to the invention.

FIG. 9 is a flow diagram 900 illustrating an exemplary method for verifying memory cell soft programming according to the invention, and will be discussed in conjunction with the exemplary system of FIG. 4 for purposes of explanation. For example, once an erase or erase verify operation has been performed to erase the data bits of a sector of memory (e.g., by writing a 1 value thereto), the method 900 begins at step 910, after which the soft program, and soft program verify modes are enabled at step 920.

The method 900 proceeds to step 925, whereat a cell address is initialized to a first address, and, for example, a pulse counter is initialized to zero at step 930. Following step 930 the first cell address is selected at step 940. The first memory cell is then soft program verified at step 950. At decision step 950, a determination is made as to whether a core cell has been properly erased, but not over erased. As illustrated and described in greater detail hereinafter with respect to FIG. 4, the soft program verification operations performed at steps 950 and 965 of the method 900, may be carried out via the application of about a 2.7 volt reference voltage to the selected core cell gate, and the application of a different reference voltage to the reference cell gate (e.g., about 3.7 volts), and then comparing the two currents, and making a determination based on that comparison whether the associated erased core cell threshold voltage is greater than 0.7 volts.

If, for example, at step 950 the selected core cell current is not less than the reference cell current, a determination is made that the core cell has a threshold voltage which is less than 0.7 volt, and the method 900 proceeds to step 955, whereat an accounting may be performed of the current number of soft program pulses which have already been applied to the core cell in an attempt to correct the erase cell threshold voltage. If a predetermined number of pulses $N_P$ has been exceeded, a determination may be made at step 955 to identify the core cell as having failed the soft program process and proceeds to step 970. In this manner, the core cell will not be subjected to repeated soft program pulses without being re-verified; the program will not hang in a never ending loop, should a selected cell be defective; and most importantly, the soft program pulse widths can be made shorter, resulting in a faster overall soft programming time, as soft programming time only need be spent in the areas of greatest need. If, however in step 955, a predetermined pulse count has not exceeded $N_P$, the method 900 proceeds to step 960, whereat the current pulse count is incremented.

After step 960, method 900 continues to step 965 for the application of a soft program pulse to core cell, and a return to step 950 for another soft program verification.

Where it is found at decision step 950 that the cell has been properly soft programmed, the method 900 proceeds to step 980, whereat it is determined whether the last cell address has been reached (e.g., in a given cell memory block or sector, or in a given multiple cell memory block or sector). For example, the method may be selectively employed to verify erasure of a certain number of the cells (e.g., eight or sixteen), which are connected in a NOR configuration, although other implementations are possible wherein any number of such cells may be serially verified according to the invention.

If the last cell address has not been reached at decision step 980, the method proceeds to step 985, whereat a soft program pulse counter may be reset prior to proceeding to step 990. At step 990 the current address is incremented before proceeding to step 940 again, whereat the next cell address is selected as before. Otherwise (e.g., all such cells have been verified), the method 900 ends at step 995.

Thus, the method 900 selectively verifies, reverifies, soft programs, and re-soft programs each cell of a dual bit memory cell in order to ensure proper soft programming prior to proceeding to another such cell at step 985, or ending at step 995.

It will be appreciated in this regard, that the method 900 may include internal counters or other steps by which a cell may be determined to be unuseable (e.g., unable to be properly soft program) after a number of unsuccessful attempts at soft programming/verification, whereby the cell (e.g., or a number of related cells, such as a byte or word) may be marked as bad, or the part itself may hang as part of a failed sector erase operation. Further in this regard, if the method 900 is employed in a manufacturing process (e.g., before or after packaging, but before shipment to a customer), redundancy may be employed to mark a cell or a number of cells as bad, and to provide alternate or redundant storage cells as a replacement, whereby acceptable manufacturing yield may be achieved. The method 900 may also be employed in association with a sector or chip soft program/verification operation initiated by an end-user, wherein a cell failure may be indicated to the user via the memory device hanging as a result.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A system for preventing erased memory cells from exhibiting an erased cell threshold voltage below a predetermined level, comprising:

a soft program control circuit configured to generate a soft program voltage pulse, a soft program core cell verification voltage, and a reference cell verification voltage having a value which is different from the soft program core cell verification voltage;

a flash memory array of core cells operably coupled to core address control circuitry, bit/column control circuitry and word/row control circuitry, wherein the flash memory array is operable to generate a core cell verification current for a selected erased core cell, and wherein the soft program control circuit is operable to selectively apply the soft program voltage pulse to only the one selected core cell which is determined to have an erased core cell threshold voltage below the predetermined voltage; and a soft program verify control circuit configured to generate a reference current using the reference cell verification voltage, and compare the core cell verification current to the reference cell current.

2. A system for preventing erased memory cells from exhibiting an erased cell threshold voltage below a predetermined level, comprising:

a soft program control circuit configured to generate a soft program voltage, a soft program core cell verification voltage, and a reference cell verification voltage having a value which is different from the soft program core cell verification voltage;

a flash memory array of core cells operably coupled to core address control circuitry, bit/column control circuitry and word/row control circuitry, wherein the flash memory array is operable to generate a core cell verification current for a selected erased core cell; and a soft program verify control circuit configured to generate a reference current using the reference cell verification voltage, and compare the core cell verification current to the reference cell current, wherein the soft program verify control circuit comprises:

a soft program verify comparator circuit configured to generate an indication of whether the selected erased core cell has an erased cell threshold voltage which is below the predetermined level based on the comparison; and a verify control logic circuit operably coupled to the soft program verify comparator circuit and configured to output one or more soft program control signals for use in soft programming the selected cell based on the indication.

3. The system of claim 2, wherein the verify control logic circuit is further operable to generate a next core cell address control signal for use in subsequent erased core cell verification when the comparator circuit indicates that the erased cell threshold voltage is above the predetermined level.

4. A system for preventing erased memory cells from exhibiting an erased cell threshold voltage below a predetermined level, comprising:

a soft program control circuit configured to generate a soft program voltage, a soft program core cell verification voltage, and a reference cell verification voltage having a value which is different from the soft program core cell verification voltage, wherein the soft program control circuit comprises:

a soft program multiplexer circuit configured to select between a program mode signal, or a soft program mode signal;

a group of two charge pumps, including a wordline charge pump circuit configured to generate a boosted wordline voltage signal, and a drain charge pump circuit configured to generate a boosted programming voltage signal; and a soft program reference voltage circuit, which is operable to select between a program mode signal, or a soft program mode signal, and in response generate a plurality of soft program verification voltages based on the selected voltage signal;

a flash memory array of core cells operably coupled to core address control circuitry, bit/column control circuitry and word/row control circuitry, wherein the flash memory array is operable to generate a core cell verification current for a selected erased core cell; and a soft program verify control circuit configured to generate a reference current using the reference cell verification voltage, and compare the core cell verification current to the reference cell current.

5. The system of claim 4, wherein the soft program multiplexer circuit comprises:
   a network of mode selection logic gates operable to generate a soft program enable signal to the reference logic circuit in response to the soft program mode signal; and
   a wordline charge pump supply circuit operable to generate a supply voltage to the wordline charge pump circuit in response to the soft program mode signal.

6. The system of claim 4, wherein the group of charge pumps, comprises:
   a wordline charge pump circuit operably coupled to the soft program multiplexer circuit and configured to generate a boosted wordline voltage in response to the soft program mode signal; and
   a drain charge pump circuit configured to generate a boosted programming voltage to the reference logic circuit in response to a program mode signal.

7. The system of claim 4, wherein the soft program reference voltage circuit comprises:
   a reference logic circuit which further selects from the charge pump voltages and their respective modes and routes the selected voltage to a verification voltage divider circuit, and is operably coupled to the soft program multiplexer circuitry and configured to receive a soft program enable command.

8. The system of claim 7, wherein the soft program reference voltage circuit further comprises:
   a verification voltage divider circuit configured to generate at least the following verification voltages:
   a 4.0 volt soft program verification voltage used as a supply for the verification voltage divider, and sent to the gate of the soft program verification mode transistor to establish the correct voltage divider ratio;
   a 3.7 volt reference voltage sent to the gate of the reference cell used to establish a predetermined reference cell current; and
   a 2.7 volt wordline voltage sent to the gate of the core cell wordline used to establish a core cell current.

9. The system of claim 8, wherein the verification voltage divider circuit comprises a network of resistors.

10. The system of claim 8, wherein the verification voltage divider circuit comprises a network of active components.

11. A method of preventing erased memory cells from exhibiting an erased cell threshold voltage below a predetermined level, comprising the steps of:
   generating a soft program verify core cell verification voltage;
   generating a reference cell verification voltage having a value which is different from the soft program verify core cell verification voltage;
   applying the soft program verify core cell verification voltage to a gate portion of an erased core cell; thereby generating a core cell current conducting therethrough;
   applying the reference cell voltage verification voltage to a gate portion of a reference cell, thereby generating a reference cell current conducting therethrough; and
   determining whether a threshold voltage associated with the erased core cell is less than a predetermined threshold based on a comparison of the core cell current and the reference cell current; and
   applying a soft programming pulse to the erased core cell if the determination indicates that the erased core cell has a threshold voltage less than the predetermined threshold, wherein the soft programming pulse has a width or magnitude which is a function of the comparison, to speed up the overall soft programming process, or to minimize the effects of over soft programming.

12. A method of preventing erased memory cells from exhibiting an erased cell threshold voltage below a predetermined level, comprising the steps of:
   generating a soft program verify core cell verification voltage;
   generating a reference cell verification voltage having a value which is different from the soft program verify core cell verification voltage;
   applying the soft program verify core cell verification voltage to a gate portion of an erased core cell; thereby generating a core cell current conducting therethrough;
   applying the reference cell voltage verification voltage to a gate portion of a reference cell, thereby generating a reference cell current conducting therethrough; and
   determining whether a threshold voltage associated with the erased core cell is less than a predetermined threshold based on a comparison of the core cell current and the reference cell current; and
   applying a soft programming pulse to the erased core cell if the determination indicates that the erased core cell has a threshold voltage less than the predetermined threshold, wherein the soft programming pulse comprises a string of two or more pulses which have duration or magnitude which is a function of the comparison.

13. A method of preventing erased dual bit flash memory cells having an oxide-nitride-oxide (ONO) charge trapping structure associated therewith from exhibiting an erased cell threshold voltage below a predetermined level, comprising the steps of:
   generating a soft program verify core cell verification voltage;
   generating a reference cell verification voltage having a value which is different from the soft program verify core cell verification voltage;
   applying the soft program verify core cell verification voltage to a gate portion of an dual bit erased core cell; thereby generating a core cell current conducting therethrough;
   applying the reference cell voltage verification voltage to a gate portion of a reference cell, thereby generating a reference cell current conducting therethrough; and
   determining whether a threshold voltage associated with the dual bit erased core cell is less than a predetermined threshold based on a comparison of the core cell current and the reference cell current.

14. The method of claim 13, further comprising the step of performing a soft program on the erased dual bit core cell if the determination indicates that the erased core cell has a threshold voltage less than the predetermined threshold.

15. The method of claim 14, wherein soft programming comprises the step of applying a soft programming pulse to the erased dual bit core cell if the determination indicates that the erased dual bit core cell has a threshold voltage less than the predetermined threshold.

16. The method of claim 15, wherein the soft programming pulse has a width or magnitude which is a function of the comparison, to speed up the overall soft programming process, or to minimize the effects of over soft programming.

17. The method of claim 15, wherein the soft programming pulse comprises a string of two or more pulses which have duration or magnitude which is a function of the comparison.

18. A system for preventing erased dual bit flash memory cells having an oxide-nitride-oxide (ONO) charge trapping structure associated therewith from exhibiting an erased cell threshold voltage below a predetermined level, comprising:
- a soft program control circuit configured to generate a soft program voltage, a soft program core cell verification voltage, and a reference cell verification voltage having a value which is different from the soft program core cell verification voltage;
- a flash memory array of dual bit core cells having ONO charge trapping structures operably coupled to core address control circuitry, bit/column control circuitry and word/row control circuitry, wherein the dual bit flash memory array is operable to generate a core cell verification current for a selected erased dual bit core cell; and
- a soft program verify control circuit configured to generate a reference current using the reference cell verification voltage, and compare the core cell verification current to the reference cell current.

19. The system of claim 18, wherein the soft program verify control circuit comprises:
- a soft program verify comparator circuit configured to generate an indication of whether the selected erased dual bit core cell has an erased cell threshold voltage which is below the predetermined level based on the comparison; and
- a verify control logic circuit operably coupled to the soft program verify comparator circuit and configured to output one or more soft program control signals for use in soft programming the selected dual bit cell based on the indication.

20. The system of claim 19, wherein the verify control logic circuit is further operable to generate a next core cell address control signal for use in subsequent erased core cell verification when the comparator circuit indicates that the erased dual bit cell threshold voltage is above the predetermined level.

21. The system of claim 18, wherein the soft program control circuit comprises:
- a soft program multiplexer circuit configured to select between a program mode signal, or a soft program mode signal;
- a group of two charge pumps, including a wordline charge pump circuit configured to generate a boosted wordline voltage signal, and a drain charge pump circuit configured to generate a boosted programming voltage signal; and
- a soft program reference voltage circuit, is operable to select between a program mode signal, or a soft program mode signal, and in response generate a plurality of soft program verification voltages based on the selected voltage signal.

22. The system of claim 21, wherein the soft program multiplexer circuit comprises:
- a network of mode selection logic gates operable to generate a soft program enable signal to the reference logic circuit in response to the soft program mode signal; and
- a wordline charge pump supply circuit operable to generate a supply voltage to the wordline charge pump circuit in response to the soft program mode signal.

23. The system of claim 21, wherein the group of charge pumps, comprises:
- a wordline charge pump circuit operably coupled to the soft program multiplexer circuit and configured to generate a boosted wordline voltage in response to the soft program mode signal; and
- a drain charge pump circuit configured to generate a boosted programming voltage to the reference logic circuit in response to a program mode signal.

24. The system of claim 21, wherein the soft program reference voltage circuit comprises:
- a reference logic circuit which further selects from the charge pump voltages and their respective modes and routes the selected voltage to a verification voltage divider circuit, and is operably coupled to the soft program multiplexer circuitry and configured to receive a soft program enable command.

25. The system of claim 24, wherein the soft program reference voltage circuit further comprises:
- a verification voltage divider circuit configured to generate at least the following verification voltages:
- a 4.0 volt soft program verification voltage used as a supply for the verification voltage divider, and sent to the gate of the soft program verification mode transistor to establish a predetermined voltage divider ratio;
- a 3.7 volt reference voltage sent to the gate of the reference cell used to establish a predetermined reference cell current; and
- a 2.7 volt wordline voltage sent to the gate of the dual bit core cell wordline used to establish a dual bit core cell current.

26. The system of claim 25, wherein the verification voltage divider circuit comprises a network of resistors.

27. The system of claim 25, wherein the verification voltage divider circuit comprises a network of active components.

* * * * *